United States Patent
Komatsu et al.

(10) Patent No.: US 12,489,427 B2
(45) Date of Patent: *Dec. 2, 2025

(54) FILTER INCLUDING ACOUSTIC WAVE RESONATOR IN PARALLEL WITH CIRCUIT ELEMENT

(71) Applicant: Skyworks Solutions, Inc., Irvine, CA (US)

(72) Inventors: Tomoya Komatsu, Irvine, CA (US); Satoru Ikeuchi, Ashiya (JP); Stephane Richard Marie Wloczysiak, Irvine, CA (US)

(73) Assignee: Skyworks Solutions, Inc., Irvine, CA (US)

( * ) Notice: Subject to any disclaimer, the term of this patent is extended or adjusted under 35 U.S.C. 154(b) by 242 days.

This patent is subject to a terminal disclaimer.

(21) Appl. No.: 18/084,014

(22) Filed: Dec. 19, 2022

(65) Prior Publication Data

US 2023/0231541 A1    Jul. 20, 2023

Related U.S. Application Data (63) Continuation of application No. 16/418,831, filed on May 21, 2019, now Pat. No. 11,563,423.
(Continued)

(51) Int. Cl.
*H03H 9/64* (2006.01)
*H03H 9/02* (2006.01)
(Continued)

(52) U.S. Cl.
CPC ...... *H03H 9/6489* (2013.01); *H03H 9/02102* (2013.01); *H03H 9/02834* (2013.01); *H03H 9/25* (2013.01); *H03H 9/48* (2013.01)

(58) Field of Classification Search
CPC ............ H03H 9/6489; H03H 9/02102; H03H 9/02834; H03H 9/25; H03H 9/48
See application file for complete search history.

(56) References Cited

U.S. PATENT DOCUMENTS 5,694,095 A    12/1997    Mineyoshi
6,747,530 B1    6/2004    Selmeier
(Continued)

FOREIGN PATENT DOCUMENTS

JP    2013-098991    5/2013

OTHER PUBLICATIONS

Yen, Sean, "Lithium Niobate Resonators and Filters Toward Reconfigurable Filter Banks," Submitted in partial fulfillment of the requirements for the degree of Doctor of Philosophy in Electrical and Computer Engineering, Carnegie Mellon University, Jun. 20, 2016, pp. 1-190.

(Continued)

*Primary Examiner* — Samuel S Outten
(74) *Attorney, Agent, or Firm* — Knobbe, Martens, Olson & Bear, LLP (57) ABSTRACT

Aspects of this disclosure relate to an acoustic wave filter that includes acoustic wave resonators arranged to filter a radio frequency signal. The acoustic wave resonators include a first acoustic wave resonator. The acoustic wave filter includes a circuit element in parallel with the first acoustic wave resonator in a stage of the acoustic wave filter. The circuit element and the first acoustic wave resonator have different resonant frequencies. The circuit element can reduce an impact of bulk mode of the first acoustic wave resonator on insertion loss of the acoustic wave filter. The first acoustic wave resonator can be a surface acoustic wave (Continued)

resonator in certain embodiments. The circuit element can be a second acoustic wave resonator or a capacitor, for example.

20 Claims, 8 Drawing Sheets

Related U.S. Application Data (60) Provisional application No. 62/676,712, filed on May 25, 2018.

(51) Int. Cl.
 *H03H 9/25* (2006.01)
 *H03H 9/48* (2006.01)

(56) References Cited

U.S. PATENT DOCUMENTS

| | | | |
|---|---|---|---|
| 6,844,795 | B2 | 1/2005 | Inose |
| 7,061,345 | B2 | 6/2006 | Misu et al. |
| 7,626,475 | B2 | 12/2009 | Taniguchi |
| 7,683,736 | B2 | 3/2010 | Inoue et al. |
| 8,923,794 | B2 | 12/2014 | Aigner |
| 9,246,536 | B2 | 1/2016 | Caron |
| 9,607,119 | B1 | 3/2017 | McHugh et al. |
| 11,563,423 | B2 | 1/2023 | Komatsu et al. |
| 2008/0238572 | A1 | 10/2008 | Funami et al. |
| 2014/0340173 | A1* | 11/2014 | Burgener ............... H03H 9/706 333/32 |
| 2017/0093370 | A1 | 3/2017 | Khlat et al. |
| 2017/0179928 | A1* | 6/2017 | Raihn .................... H03H 9/542 |
| 2017/0244382 | A1 | 8/2017 | Lear |
| 2017/0338801 | A1 | 11/2017 | Hay-Shipton et al. |
| 2019/0081613 | A1 | 3/2019 | Nosaka |
| 2019/0363692 | A1 | 11/2019 | Nosaka |
| 2019/0363696 | A1 | 11/2019 | Komatsu et al. |
| 2019/0379352 | A1* | 12/2019 | Nosaka ............... H03H 9/6403 |

OTHER PUBLICATIONS

International Search Report mailed Sep. 10, 2019 for International Patent Application No. PCT/US2019/033370 in 3 pages.
Written Opinion mailed Sep. 10, 2019 for International Patent Application No. PCT/US2019/033370 in 7 pages.

\* cited by examiner

FILTER INCLUDING ACOUSTIC WAVE RESONATOR IN PARALLEL WITH CIRCUIT ELEMENT

INCORPORATION BY REFERENCE TO ANY PRIORITY APPLICATIONS

Any and all applications, if any, for which a foreign or domestic priority claim is identified in the Application Data Sheet of the present application are hereby incorporated by reference under 37 CFR 1.57.

BACKGROUND

Technical Field

Embodiments of this disclosure relate to a filter that includes an acoustic wave resonator.

Description of Related Technology

An acoustic wave filter can include a plurality of acoustic wave resonators arranged to filter a radio frequency signal. Acoustic wave resonators can be arranged as a ladder filter to filter the radio frequency signal. Example acoustic wave filters include surface acoustic wave (SAW) filters and bulk acoustic wave (BAW) filters. Certain SAW filters include temperature compensation. Such filters can be referred to as temperature compensated SAW (TCSAW) filters.

Acoustic wave filters can be implemented in radio frequency electronic systems. For instance, filters in a radio frequency front end of a mobile phone can include acoustic wave filters.

SUMMARY OF CERTAIN INVENTIVE ASPECTS

The innovations described in the claims each have several aspects, no single one of which is solely responsible for its desirable attributes. Without limiting the scope of the claims, some prominent features of this disclosure will now be briefly described.

One aspect of this disclosure is a surface acoustic wave filter that includes surface acoustic wave resonators configured to filter a radio frequency signal. The surface acoustic wave resonators include a first surface acoustic wave resonator. The surface acoustic wave filter includes a circuit element in parallel with the first surface acoustic wave resonator in a stage of the surface acoustic wave filter. The circuit element and the first surface acoustic wave resonator have different resonant frequencies.

The first surface acoustic wave resonator and the circuit element can be included in a shunt arm of the surface acoustic wave filter. The first surface acoustic wave resonator and the circuit element can be included in a series arm of the surface acoustic wave filter.

The circuit element can be a second surface acoustic wave resonator of the surface acoustic wave resonators. The second surface acoustic wave resonator can be arranged to lower impedance at a bulk mode frequency of the first surface acoustic wave resonator. The surface acoustic wave filter can be configured to provide a first open corresponding to a resonant frequency of the first surface acoustic wave resonator and to provide a second open corresponding to a resonant frequency of the second surface acoustic wave resonator.

The circuit element can be a capacitor. The capacitor can be arranged to pass a frequency component at a bulk mode frequency of the first surface acoustic wave resonator.

The surface acoustic wave filter can further include a second circuit element in parallel with the first surface acoustic wave resonator. In such instances, the circuit element can be a second surface acoustic wave resonator of the surface acoustic wave resonators and the second circuit element can be a capacitor.

The first surface acoustic wave resonator can be a temperature compensated surface acoustic wave resonator. The first surface acoustic wave resonator can includes an interdigital transducer electrode on a piezoelectric layer and silicon dioxide on the interdigital transducer electrode opposite to the piezoelectric layer.

The surface acoustic wave filter can be arranged as a multi-band elimination filter.

The surface acoustic wave resonator can further include a second circuit element in parallel with a second surface acoustic wave resonator of the surface acoustic wave resonators in a second stage of the surface acoustic wave filter, in which the second circuit element and the second surface acoustic wave resonator have different resonant frequencies.

Another aspect of this disclosure is an acoustic wave filter assembly that includes a first acoustic wave filter coupled to a common node and a second acoustic wave filter coupled to the common node. The second acoustic wave filter includes an acoustic wave resonator in parallel with a circuit element in a stage of the second acoustic wave filter. The acoustic wave resonator and the circuit element have different resonant frequencies. The second acoustic wave filter is arranged to suppress a frequency associated with a passband of the first acoustic wave filter in a frequency response of the second acoustic wave filter.

The acoustic wave filter assembly can further include a third acoustic wave filter coupled to the common node and a fourth acoustic wave filter coupled to the common node. A multiplexer can include the first acoustic wave filter and the second acoustic wave filter. Such a multiplexer can be a quadplexer, for example. In some instances, a switch can be coupled between the first acoustic wave filter and the common node.

The second acoustic wave filter can be arranged as a multi-band elimination filter. The second acoustic wave filter can include temperature compensated surface acoustic wave resonators.

The acoustic wave filter assembly can further include a third acoustic wave filter coupled to the common node, in which the second acoustic wave filter is arranged to suppress a frequency associated with a passband of the third acoustic wave filter in the frequency response of the second acoustic wave filter.

The circuit element can be a capacitor. In some other instances, the acoustic wave resonator can be a first surface acoustic wave resonator and the circuit element is a second surface acoustic wave resonator.

The acoustic wave resonator and the circuit element can be arranged to suppress the frequency associated with the passband of the first acoustic wave filter in the frequency response of the second acoustic wave filter.

Another aspect of this disclosure is a wireless communication device that includes an antenna and a multiplexer coupled to the antenna. The multiplexer includes a plurality of filters coupled to a common node and arranged to filter radio frequency signals. The filters include a surface acoustic wave filter including a surface acoustic wave resonator and a circuit element in parallel with the first surface acoustic wave resonator in a stage of the surface acoustic wave filter. The circuit element and the surface acoustic wave resonator have different resonant frequencies. The surface acoustic wave filter is arranged to suppress a frequency associated with a passband of another filter of the filters in a frequency response of the surface acoustic wave filter.

The surface acoustic wave filter can be a band elimination filter. The multiplexer can be included in a radio frequency front end. The multiplexer can be included in a diversity receive module. The multiplexer can be a quadplexer. The multiplexer can be a triplexer. The multiplexer can include one or more suitable features of the surface acoustic wave filters and/or filter assemblies disclosed herein. The wireless communication device can be a mobile phone, for example.

For purposes of summarizing the disclosure, certain aspects, advantages and novel features of the innovations have been described herein. It is to be understood that not necessarily all such advantages may be achieved in accordance with any particular embodiment. Thus, the innovations may be embodied or carried out in a manner that achieves or optimizes one advantage or group of advantages as taught herein without necessarily achieving other advantages as may be taught or suggested herein.

BRIEF DESCRIPTION OF THE DRAWINGS

Embodiments of this disclosure will be described, by way of non-limiting example, with reference to the accompanying drawings.

DETAILED DESCRIPTION OF CERTAIN EMBODIMENTS

The following detailed description of certain embodiments presents various descriptions of specific embodiments. However, the innovations described herein can be embodied in a multitude of different ways, for example, as defined and covered by the claims. In this description, reference is made to the drawings where like reference numerals can indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

A pure pass filter can pass frequencies except frequencies within one or more elimination bands. A pure pass filter can be referred to as a band elimination filter. In a pure pass filter that includes surface acoustic wave resonators, the bulk mode propagating in the piezoelectric substrate and occurring at higher frequency than a response of the pure pass filter can degrade insertion loss performance. Aspects of this disclosure relate to reducing ripple in insertion loss caused by a bulk mode response of a surface acoustic wave device.

A pure pass filter can be implemented in a multiplexer that includes a plurality of filters coupled together at a common node. Signal leakage from one or more filters can impact performance of the pure pass filter. Aspects of this disclosure relate to suppressing such leakage.

Bulk acoustic wave devices can be used for pure pass filters, as bulk acoustic wave devices typically do not have multiple responses within a relatively wide band frequency range. In surface acoustic wave devices, increasing surface mass loading can relatively shift the bulk mode frequency since this can change the surface acoustic wave velocity without bulk mode velocity. However, the desired amount of such a shift can be too large to practically implement for certain pure pass filter applications.

Aspects of this disclosure relate to an acoustic wave filter that includes an acoustic wave resonator in parallel with a circuit element, in which the acoustic wave resonator and the circuit element have different resonant frequencies. The acoustic wave resonator can be a surface acoustic wave resonator, such as a temperature compensated surface acoustic wave resonator. A first acoustic wave resonator having a first resonant frequency can be in parallel with a capacitor or/and a second acoustic wave resonator having a second resonant frequency. The capacitor can have a capacitance such that the capacitor passes signals at a bulk mode frequency in the first acoustic wave resonator. The first acoustic wave resonator and the second acoustic wave resonator can be arranged to have lower impedance at the bulk mode frequency of the other respective resonator. The disclosed technology can be implemented in multiplexers that include a plurality of filters coupled to a common node.

With the technology described herein, a pure pass filter can be implemented using surface acoustic wave device technology and still meet performance specifications. Compared with bulk acoustic wave devices, surface acoustic wave devices can typically have smaller chip size and reduced cost. Accordingly, surface acoustic wave pure pass filters in accordance with the principles and advantages discussed herein can meet performance specifications with smaller chip size and reduced cost relative to bulk acoustic wave pure pass filters.

Figure 1:
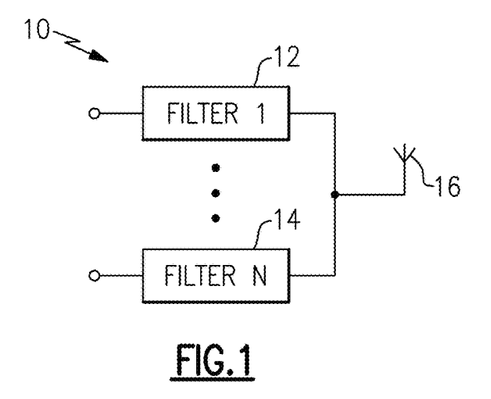
FIG. 1 is a schematic diagram of an example multiplexer in communication with an antenna.

FIG. 1 is a schematic diagram of a radio frequency system 10 that includes an example multiplexer in communication with an antenna 16. The illustrated multiplexer includes a plurality of filters 12 and 14 coupled to a common node. In FIG. 1, the common node is a node at which the filters are coupled to the antenna 16. The common node in FIG. 1 can be referred to as an antenna node. The multiplexer can include two or more filters coupled to a common node. A multiplexer can be a duplexer, a triplexer, a quadplexer, etc. An acoustic wave filter assembly can include the multiplexer. Some or all of the filters of a multiplexer can be acoustic wave filters. The multiplexer can be included in a diversity receive module or a front end module, for example.

A filter 12 of the multiplexer of FIG. 1 can be a band elimination filter. The filter 12 can include a surface acoustic wave resonator in parallel with a circuit element. The circuit element in parallel with the surface acoustic wave resonator can reduce ripple in insertion loss caused by a bulk mode response of the surface acoustic wave resonator. Suppressing the bulk mode response of the surface acoustic wave resonator can improve performance of the filter.

Figure 2A:
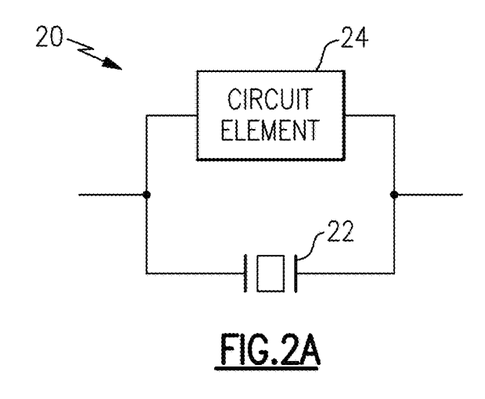
FIG. 2A is a schematic diagram of acoustic wave resonator in parallel with a circuit element, which can be implemented in a filter of the multiplexer of FIG. 1 according to an embodiment.
Figure 2B:
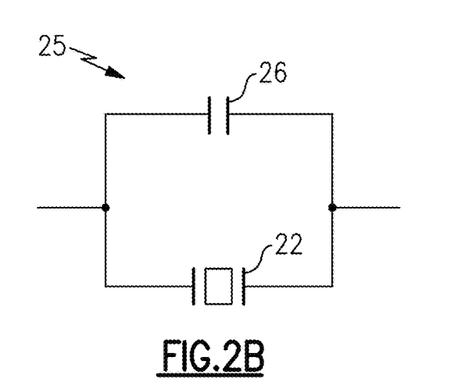
FIG. 2B is a schematic diagram of acoustic wave resonator in parallel with a capacitor, which can be implemented in a filter of the multiplexer of FIG. 1 according to an embodiment.
Figure 2C:
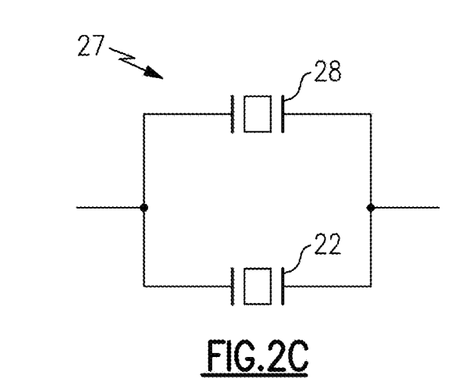
FIG. 2C is a schematic diagram of acoustic wave resonator in parallel with another acoustic wave resonator, which can be implemented in a filter of the multiplexer of FIG. 1 according to an embodiment.

FIGS. 2A, 2B, and 2C illustrate example circuits that can be included in the filter 12 of FIG. 1. These example circuits can be implemented in a filter included in a multiplexer and/or in a standalone filter. Any of the principles and advantages of these example circuits can be implemented together with each other as suitable. In the context of a multiplexer that includes at least a first filter and a second filter, FIGS. 2A, 2B, and 2C provide example circuits that an acoustic wave resonator and a circuit element arranged in parallel with each other that can be included in the second filter arranged to suppress a frequency associated with a passband of the first filter in a frequency response of the second filter. The example circuits of FIGS. 2A, 2B, and 2C can be included with other surface acoustic wave resonators in a surface acoustic wave filter. The example circuits shown in any of FIGS. 2A, 2B, and 2C can be included in series arm and/or shunt arm in an acoustic wave filter. The example circuits include a surface acoustic wave resonator in parallel with a circuit element in a stage of a surface acoustic wave filter. The stage of the acoustic wave filter can be a ladder stage that includes a series resonator and a shunt resonator. In the context of a ladder stage, the surface acoustic wave resonator of any of the example circuits can implement the series resonator or the shunt resonator of the ladder stage.

FIG. 2A is a schematic diagram of resonant circuit 20 that includes a surface acoustic wave resonator 22 in parallel with a circuit element 24. The circuit element 24 has a different resonant frequency than the surface acoustic wave resonator 22. The surface acoustic wave resonator 22 and the circuit element 24 can be in parallel in a stage of a filter. For example, the surface acoustic wave resonator 22 and the circuit element 24 can be in parallel in a ladder stage of the filter 12 of the multiplexer 10 of FIG. 1. The resonant circuit 20 can implement a series arm of a ladder filter in certain applications. The resonant circuit 20 can implement a shunt arm of a ladder filter in some other applications.

FIG. 2B is a schematic diagram of resonant circuit 25 that includes a surface acoustic wave resonator 22 in parallel with a capacitor 26. The capacitor 26 can have a different resonant frequency than the surface acoustic wave resonator 22. The capacitor 26 can have a capacitance such that the capacitor 26 passes signals at a bulk mode frequency in the surface acoustic wave resonator 22. The surface acoustic wave resonator 22 and the capacitor 26 can be in parallel in a stage of a filter. For example, the surface acoustic wave resonator 22 and the capacitor 26 can be in parallel in a ladder stage of the filter 12 of the multiplexer 10 of FIG. 1. The resonant circuit 25 can implement a series arm of a ladder filter in certain applications. The resonant circuit 25 can implement a shunt arm of a ladder filter in some other applications.

FIG. 2C is a schematic diagram of resonant circuit 27 that includes a first surface acoustic wave resonator 22 in parallel with a second surface acoustic wave resonator 28. The first surface acoustic wave resonator 22 and the second surface acoustic wave resonator 28 can be arranged to have lower impedance at the bulk mode frequency of the other respective surface acoustic wave resonator.

A surface acoustic wave resonator 22 and/or 28 of any of FIGS. 2A to 2C can be temperature compensated surface acoustic wave resonators. Temperature compensated surface acoustic wave resonators can include a temperature compensation layer (for example, silicon dioxide) over an interdigital transducer electrode opposite to a piezoelectric layer. The temperature compensation layer can bring a temperature coefficient of frequency (TCF) of a surface acoustic wave resonator closer to zero relative to a similar surface acoustic wave resonator that does not include the temperature compensation layer.

With temperature compensated surface acoustic wave resonators, there can be loss due to a guided mode at 1.3 times a resonant frequency and 1.8 times the resonant frequency. The influence of a guided mode spurious response in a band pass filter can be dealt with by adding LC resonator. However, in a band elimination filter, it can be more challenging to suppress a guided mode spurious response due to the band elimination filter forming an attenuation band by itself at 1.3 times a resonant frequency and 1.8 times the resonant frequency. The attenuation level can be in a range from about 2 decibels (dB) to 4 dB. The resonant circuits 20, 25, and 27 of FIGS. 2A, 2B, and 2C, respectively, can advantageously suppress the guided mode spurious response in band elimination filters that include temperature compensated surface acoustic wave resonators.

Although embodiments are discussed with reference to surface acoustic wave resonators, any suitable principles and advantages discussed herein can be implemented in other types of acoustic wave resonators, such as boundary acoustic wave resonators and/or Lamb wave resonators. Surface acoustic wave resonators, boundary acoustic wave resonators, and Lamb wave resonators are types of acoustic wave resonators that typically include IDT electrodes.

Figure 3:
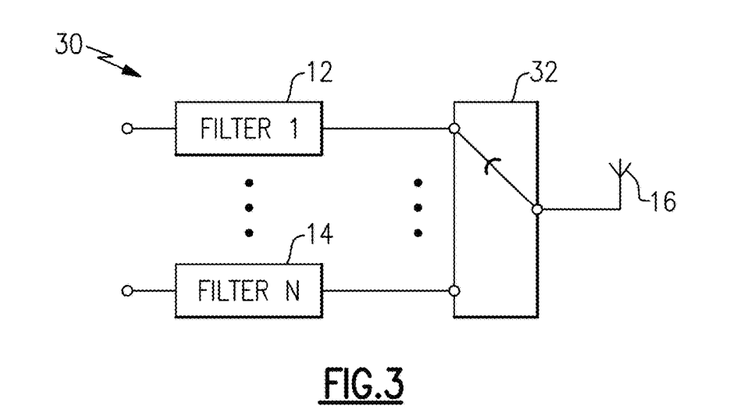
FIG. 3 is a schematic diagram of example filters in communication with an antenna by way of a switch.

A plurality of filters can be in communication with an antenna by way of a switch. FIG. 3 is a schematic diagram of a radio frequency system 30 that includes a plurality of filters 12 and 14 in communication with an antenna 16 by way of a switch 32. An acoustic wave filter assembly can include the filters 12 and 14. The filters 12 and 14 and the switch 32 can implement switch-plexing. The switch-plexing can implement on-demand multiplexing. The filter 12 and/or 14 can be implemented in accordance with any suitable principles and advantages discussed herein.

Figure 4:
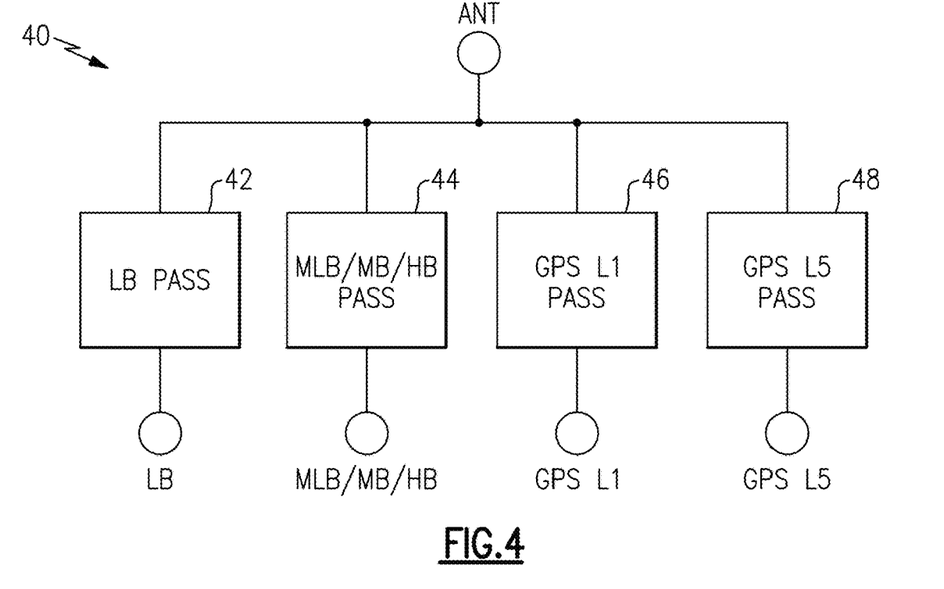
FIG. 4 is a schematic diagram of an example quadplexer that includes a filter according to an embodiment.

FIG. 4 is a schematic diagram of an example quadplexer 40 that includes a filter according to an embodiment. An acoustic wave filter assembly can include the quadplexer 40. As illustrated, the quadplexer 40 includes a low band pass filter 42, a mid-low band/mid-band/high band pass filter 44, a Global Positioning System (GPS) L1 pass filter 46, and a GPS L5 pass filter 48. These four filters are coupled to each other at an antenna node ANT. The filter 44 can have a first electrical open at a GPS L1 frequency and a second electrical open at a GPS L5 frequency. Accordingly, the filter 44 can operate as a multi-band elimination filter. The GPS L1 frequency can be centered at about 1575 megahertz (MHz). The GPS L5 frequency can be centered at about 1176 MHz. The filter 44 can include a surface acoustic wave resonator in parallel with a capacitor and/or another surface acoustic wave resonator in a stage of the filter 44. For example, the filter 44 can include one or more resonant circuits 20 of FIG. 2A, one or more resonant circuits 25 of FIG. 2B, one or more resonant circuits 27 of FIG. 2C, or any suitable combination thereof. The quadplexer 40 can be implemented in a diversity receive module, for example. Although embodiments are discussed with reference to the filter 44, any suitable principles and advantages discussed herein can be implemented in other filters such as band pass filters, low pass filters, or high pass filters.

Figure 5:
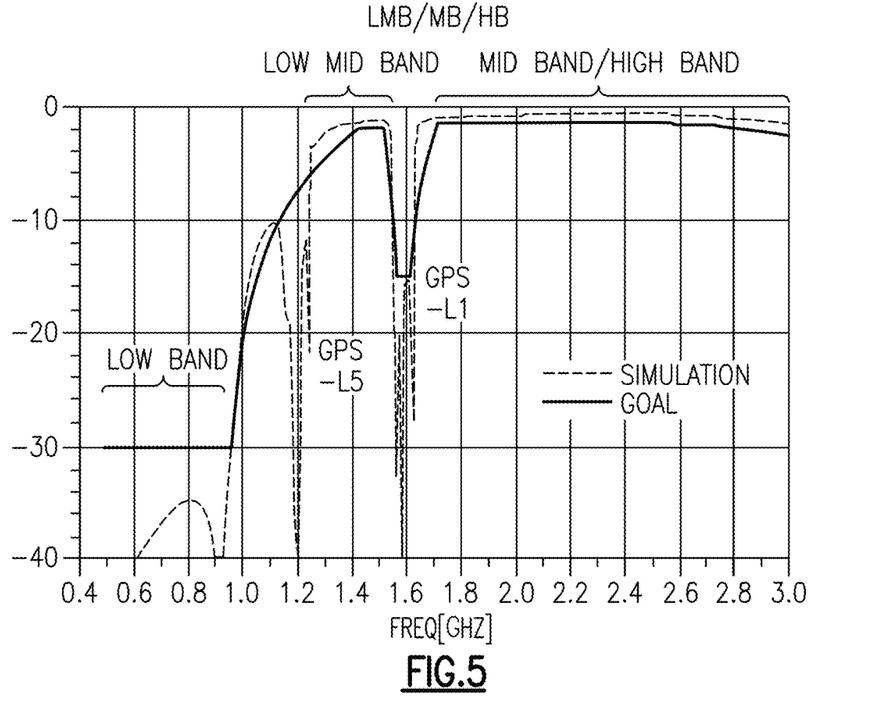
FIG. 5 is a graph comparing a simulated transfer function of a filter of FIG. 4 to a desired filter response.

FIG. 5 is a graph comparing a simulated transfer function of the filter 44 of FIG. 4 according to an embodiment to a desired filter response. As shown in FIG. 5, the filter 44 provides stronger attenuation for low band frequencies than the desired filter response. The filter 44 also provides stronger attenuation at GPS L1 and GPS L5 frequencies than the desired response. The filter 44 can include an acoustic wave resonator and a circuit element arranged in parallel with each other to suppress a frequency associated with a GPS L1 passband of the filter 46. The filter 44 can include an acoustic wave resonator and a circuit element arranged in parallel with each other to suppress a frequency associated with a GPS L5 passband of the filter 48. Mid-low band and mid-band/high band frequencies of the filter 44 can have lower insertion loss than the desired response, for example, as shown in FIG. 5.

Figure 6:
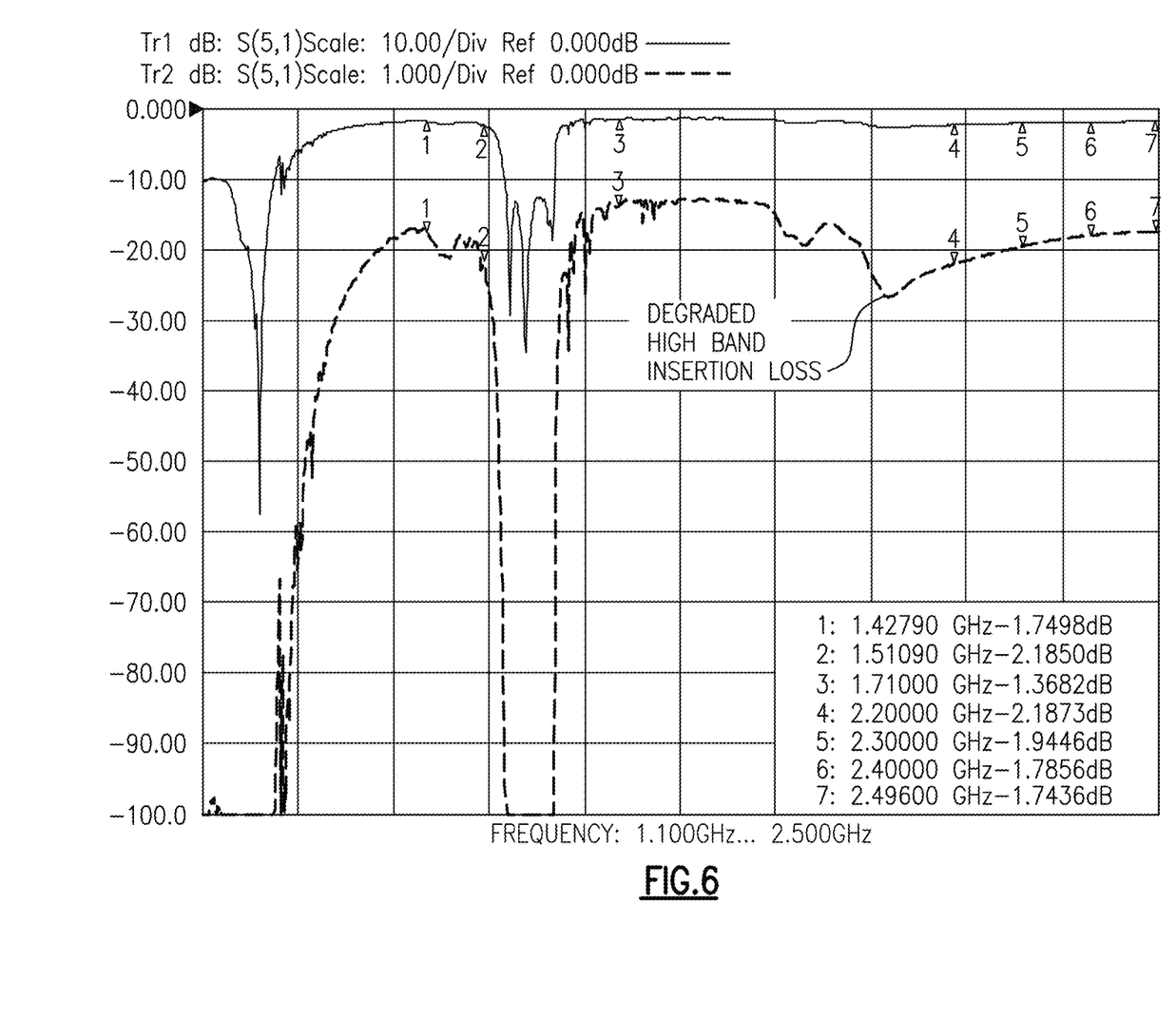
FIG. 6 is a graph with a simulated frequency response of a filter.

FIG. 6 is a graph with a simulated frequency response of a filter that has degraded high band insertion loss. This can be due to the bulk wave propagating into a piezoelectric substrate (e.g., a lithium niobate substrate). This bulk wave propagation can be more pronounced for TCSAW filters than other SAW filters. The degraded insertion loss shown in FIG. 6 can be compensated for by applying principles and advantages discussed herein.

FIGS. 7A to 8C illustrate examples of how components of the filter 44 of FIG. 4 can produce a frequency response that meets specifications of the desired frequency response, such as the desired frequency response shown in FIG. 5.

Figure 7A:
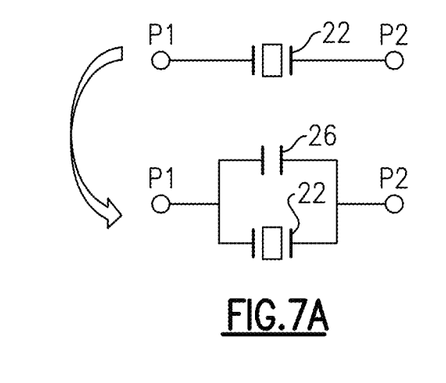
FIG. 7A illustrates a baseline acoustic wave resonator and an acoustic wave resonator in parallel with a capacitor.

FIG. 7A illustrates a baseline surface acoustic wave resonator 22 and a surface acoustic wave resonator 22 in parallel with a capacitor 26. In certain instances, the surface acoustic wave resonator 22 and the capacitor 26 can be integrated on the same die.

Figure 7B:
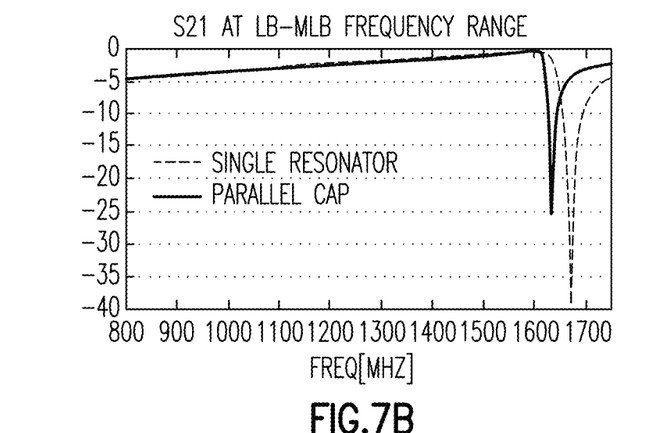
FIG. 7B compares frequency responses of the baseline acoustic wave resonator and the acoustic wave resonator in parallel with the capacitor of FIG. 7A for a first frequency range.

FIG. 7B compares frequency responses of the baseline surface acoustic wave resonator 22 and the surface acoustic wave resonator 22 in parallel with the capacitor 26 for a low band to mid low band frequency range. The surface acoustic wave resonator 22 in parallel with the capacitor 26 corresponds to the resonant circuit 26 of FIG. 2B. As shown in FIG. 7B, the parallel capacitor 26 can shift the notch in the low band to mid low band frequency range to a lower frequency. FIG. 7B indicates that the capacitor 26 can reduce the notch depth.

Figure 7C:
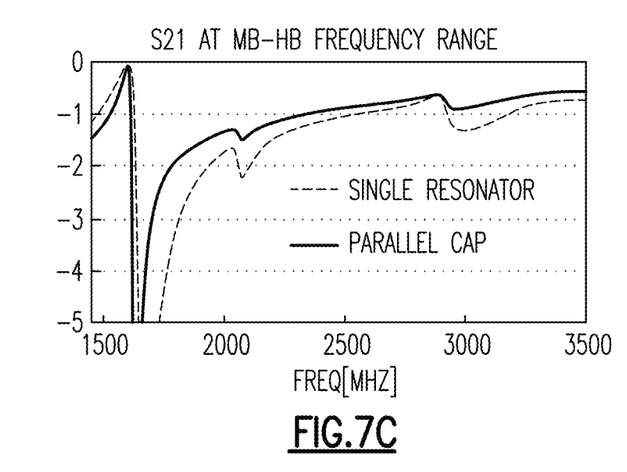
FIG. 7C compares frequency responses of the baseline acoustic wave resonator and the acoustic wave resonator in parallel with the capacitor of FIG. 7A for a second frequency range.

FIG. 7C compares frequency responses of the baseline acoustic wave resonator and the acoustic wave resonator in parallel with the capacitor of FIG. 7A for a mid band to high band frequency range. FIG. 7C illustrates that the parallel capacitor 26 can reduce ripple in the frequency response from port P1 to port P2. In certain instances, the port P1 can be an antenna port and port P2 can be a receive port. As also shown in FIG. 7C, the parallel capacitor 26 can reduce insertion loss in the mid band to high band frequency range.

Figure 8A:
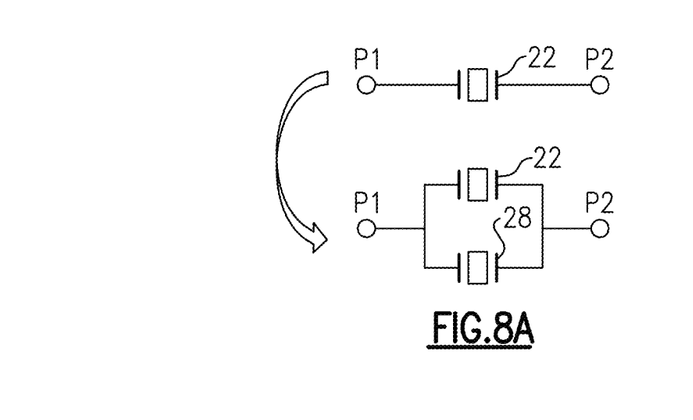
FIG. 8A illustrates a baseline acoustic wave resonator and parallel acoustic wave resonators.

FIG. 8A illustrates a baseline surface acoustic wave resonator 22 and parallel surface acoustic wave resonators 22 and 28. The parallel surface acoustic wave resonators 22 and 28 correspond to the resonant circuit 27 of FIG. 2C. The surface acoustic wave resonator 28 can compensate for a spurious response outside of the pass band and/or leakage of the surface acoustic wave resonator 22. The surface acoustic wave resonators 22 and 28 can be integrated on a single die. In some instances, parallel acoustic wave resonators can be of different technologies and/or implemented on separate die.

Figure 8B:
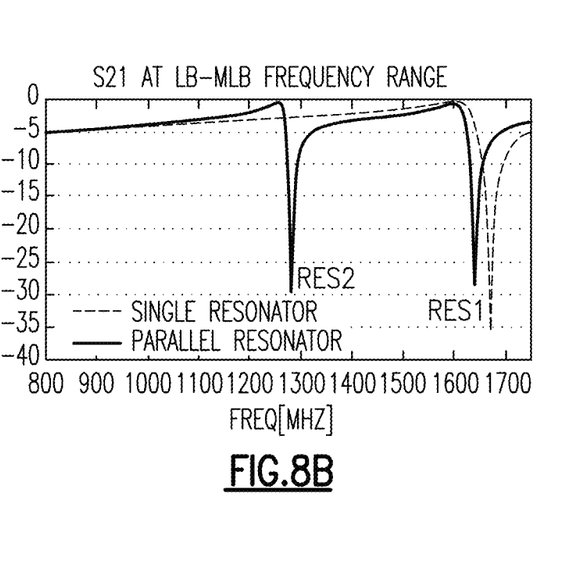
FIG. 8B compares frequency responses of the baseline acoustic wave resonator and the parallel acoustic wave resonators of FIG. 8A for a first frequency range.

FIG. 8B compares frequency responses of the baseline surface acoustic wave resonator 22 and parallel surface acoustic wave resonators 22 and 28 for a low band to mid low band frequency range. As shown in FIG. 8B, the parallel surface acoustic wave resonators 22 and 28 can shift a notch in the low band to mid-low band frequency range to a lower frequency relative to only the surface acoustic wave resonator 22 and also generate a second notch in this frequency range. The two notches can correspond to open frequencies in the at the GPS L1 and GPS L5 frequency bands for the filter 44 in the multiplexer 40 of FIG. 4.

Figure 8C:
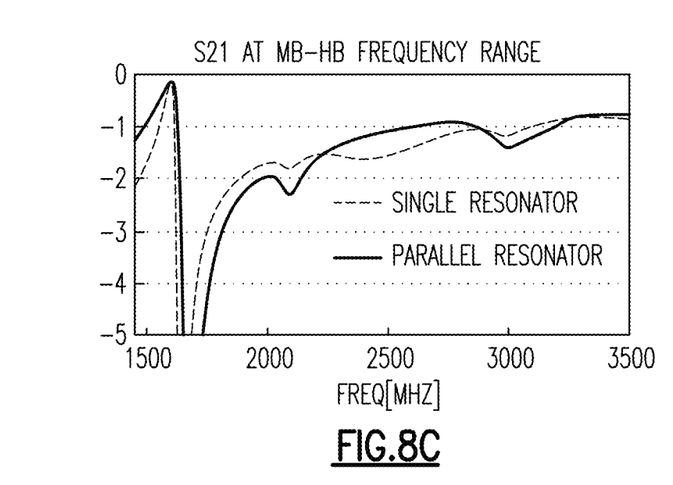
FIG. 8C compares frequency responses of the baseline acoustic wave resonator and the parallel acoustic wave resonators of FIG. 8A for a second frequency range.

FIG. 8C compares frequency responses of the baseline surface acoustic wave resonator 22 and parallel surface acoustic wave resonators 22 and 28 for a mid band to high band frequency range. FIG. 8C illustrates that the parallel surface acoustic wave resonators 22 and 28 can reduce ripple in the frequency response from Port P1 to port P2 relative to a single surface acoustic wave resonator 22. Accordingly, with the parallel surface acoustic wave resonators 22 and 28, there can be a smaller bulk mode spurious response relative to using a single surface acoustic wave resonator and multiple open frequencies in the frequency response.

FIGS. 7A and 8A illustrate example circuit topologies that can enhance performance of the filter 44 in the multiplexer 40 of FIG. 4. The principles and advantages associated with FIGS. 7A to 8C can be applied in connection with an acoustic wave resonator in parallel with two or more other circuit elements.

Figure 9:
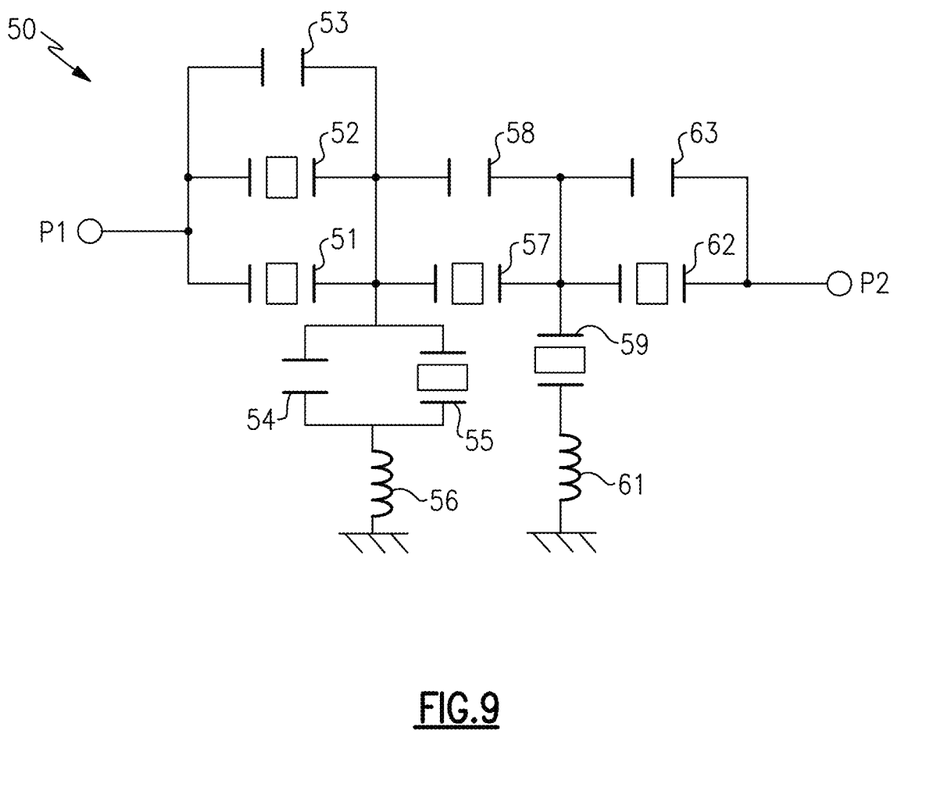
FIG. 9 is a schematic diagram of a filter according to an embodiment.

FIG. 9 is a schematic diagram of an example filter 50 according to an embodiment. The filter 50 can be a pure-pass filter. The filter 50 is an example of the filter 44 of FIG. 4. In the filter 50, port P1 can be an antenna port and port P2 can be a receive output port. The illustrated filter 50 includes surface acoustic wave resonators 51, 52, 55, 57, 59, and 62, capacitors 53, 54, 58, and 63, and inductors 56 and 61. As shown in FIG. 9, the filter 50 includes a plurality of parallel circuits in stages of the filter 50, which each include a surface acoustic wave resonator in parallel with a capacitor and/or another surface acoustic wave resonator. One or more of the surface acoustic wave resonators 51, 52, 55, 57, 59, and 62 can be temperature compensated surface acoustic wave resonators. In certain applications, all of the surface acoustic wave resonators 51, 52, 55, 57, 59, and 62 can be temperature compensated surface acoustic wave resonators.

As shown in FIG. 9, a first series arm of the filter 50 includes the surface acoustic wave resonator 51 in parallel with the surface acoustic wave resonator 52 and also in parallel with the capacitor 53. A first shunt arm of the filter 50 includes the surface acoustic wave resonator 55 in parallel with the capacitor 54. The surface acoustic wave resonator 55 and the capacitor 54 form a resonant circuit corresponding to the resonant circuit 25 of FIG. 2B. A second series arm of the filter 50 includes the surface acoustic wave resonator 57 in parallel with the capacitor 58. The surface acoustic wave resonator 57 and the capacitor 58 form a resonant circuit corresponding to the resonant circuit 25 of FIG. 2B. A third series arm of the filter 50 includes the surface acoustic wave resonator 62 in parallel with the capacitor 63. The surface acoustic wave resonator 62 and the capacitor 63 form a resonant circuit corresponding to the resonant circuit 25 of FIG. 2B.

Figure 10A:
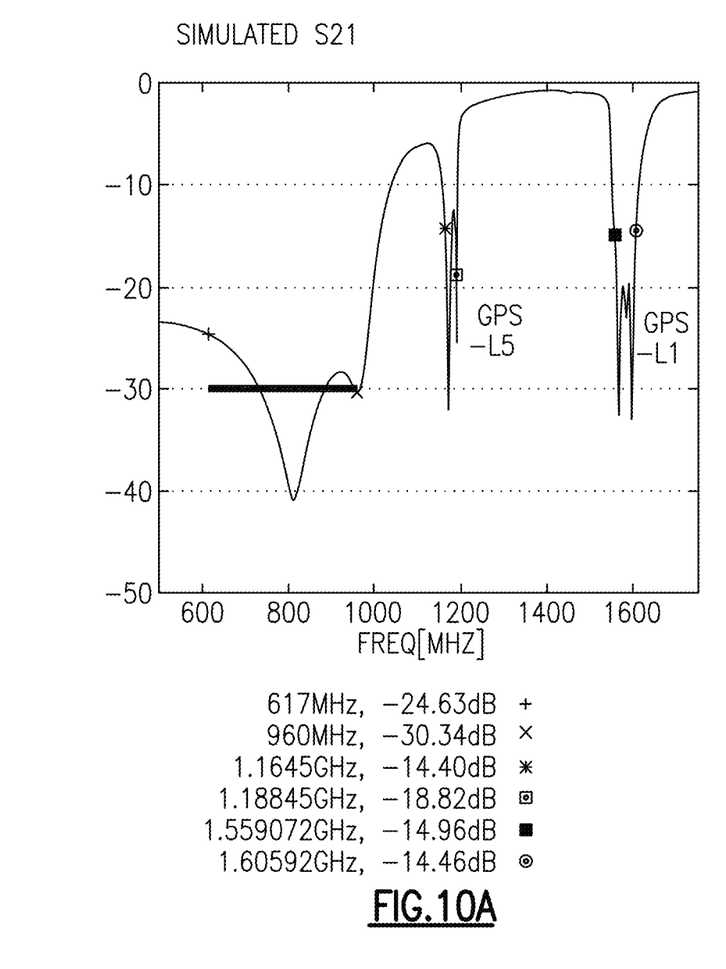
FIG. 10A is a graph of a simulated frequency response of the filter of FIG. 9 for a first frequency range.

FIG. 10A is a graph of a simulated frequency response of the filter 50 of FIG. 9 for a first frequency range. This simulation is for a standalone filter and does not account for loss associated with a multiplexer (e.g., a quadplexer). As shown in FIG. 10A, the frequency response includes notches at a GPS L1 frequency band and a GPS L5 frequency band.

Figure 10B:
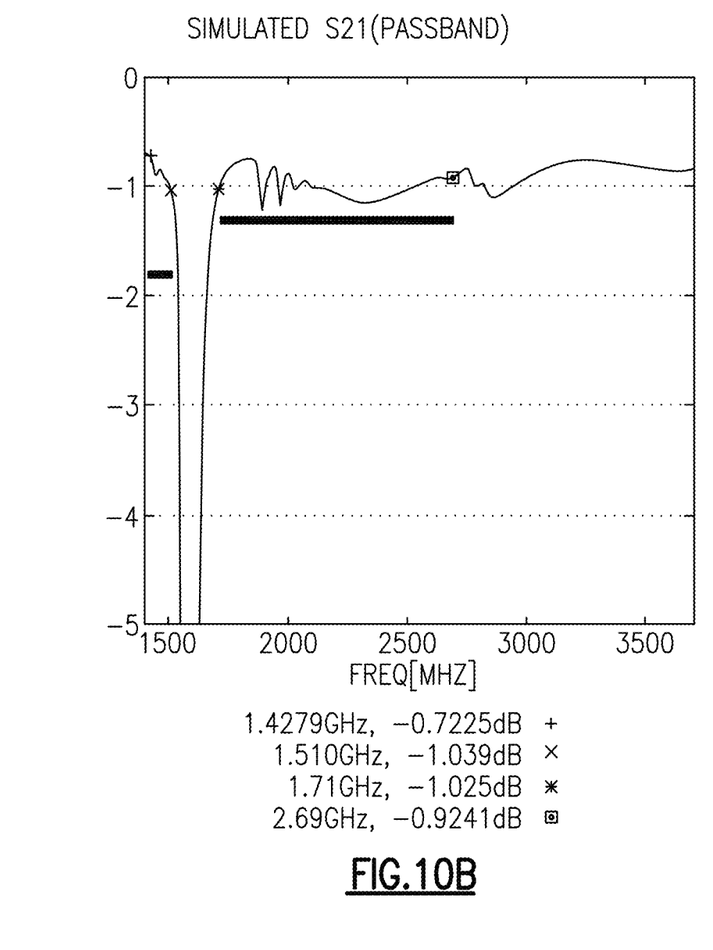
FIG. 10B is a graph of a simulated frequency response of the filter of FIG. 9 for a second frequency range.

FIG. 10B is a graph of a simulated frequency response of the filter 50 of FIG. 9 for a second frequency range. This simulation is for a standalone filter and does not account for loss associated with a multiplexer (e.g., a quadplexer). The second frequency range includes the passband of the filter 50. FIG. 10B indicates that the parallel circuits of the filter 50 can provide a flatter frequency response for mid-band/high band frequencies relative to including a single resonator in place of each parallel circuit.

Filters disclosed herein can implement methods of filtering radio frequency signals. Such methods can include providing a radio frequency signal to an acoustic wave filter and filtering the radio frequency signal with the acoustic wave filter. The acoustic wave filter includes an acoustic wave resonator in parallel with a circuit element in a stage of the acoustic wave filter, in which the acoustic wave resonator and the circuit element have different resonant frequencies. The circuit element can be a second acoustic wave resonator or a capacitor, for example. The acoustic wave filter can be a band elimination filter. In the context of a multiplexer that includes the acoustic wave filter, such a band elimination filter can suppress one or more frequency bands associated with a respective pass band of another filter of the multiplexer. The acoustic wave filter can be implemented in accordance with any suitable principles and advantages disclosed herein.

Figure 11:
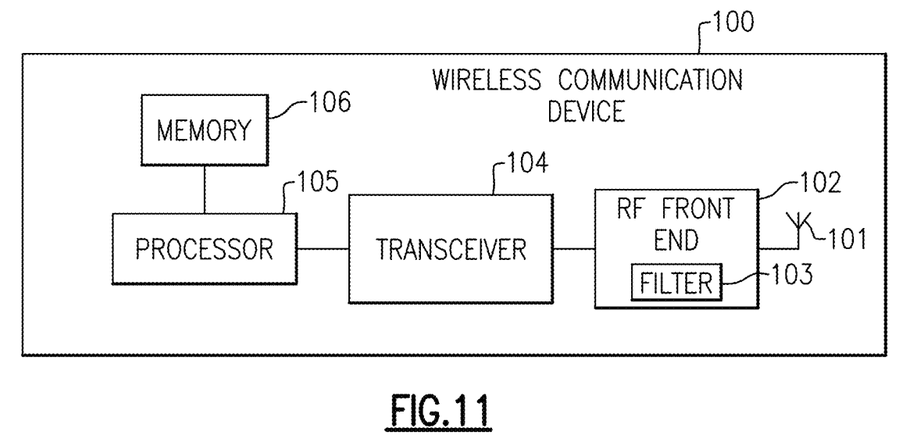
FIG. 11 is a schematic block diagram of a wireless communication device that includes a filter in accordance with one or more embodiments.

FIG. 11 is a schematic diagram of a wireless communication device 100 that includes a filter 103 in a radio frequency front end 102 according to an embodiment. The wireless communication device 100 can be any suitable wireless communication device. For instance, a wireless communication device 100 can be a mobile phone, such as a smart phone. As illustrated, the wireless communication device 100 includes an antenna 101, an RF front end 102, a transceiver 104, a processor 105, and a memory 106. The antenna 101 can transmit RF signals provided by the RF front end 102. Such RF signals can include carrier aggregation signals. The antenna 101 can provide received RF signals to the RF front end 102 for processing. Such RF signals can include carrier aggregation signals.

The RF front end 102 can include one or more power amplifiers, one or more low noise amplifiers, RF switches, receive filters, transmit filters, duplex filters, multiplexers, frequency multiplexing circuits, or any combination thereof. The RF front end 102 can transmit and receive RF signals associated with any suitable communication standards. The filter 103 can be implemented in accordance with any suitable principles and advantages of the filters discussed herein. For instance, the filter 103 can implement any suitable combination of features discussed with reference to any of FIGS. 1 to 10B.

The transceiver 104 can provide RF signals to the RF front end 102 for amplification and/or other processing. The transceiver 104 can also process an RF signal provided by a low noise amplifier of the RF front end 102. The transceiver 104 is in communication with the processor 105. The processor 105 can be a baseband processor. The processor 105 can provide any suitable base band processing functions for the wireless communication device 100. The memory 106 can be accessed by the processor 105. The memory 106 can store any suitable data for the wireless communication device 100.

Figure 12:
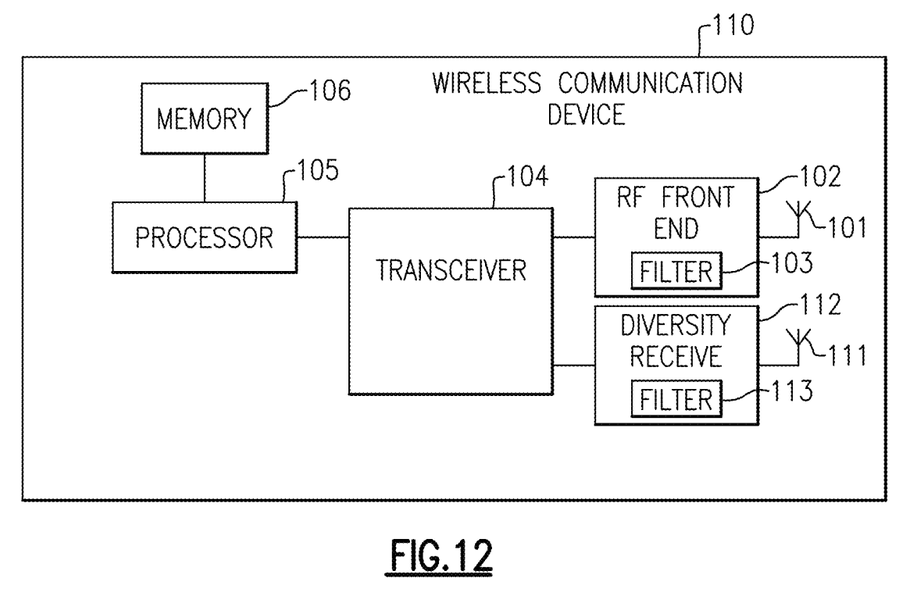
FIG. 12 is a schematic block diagram of another wireless communication device that includes a filter in accordance with one or more embodiments.

FIG. 12 is a schematic diagram of a wireless communication device 110 that includes a filter 103 in a radio frequency front end 102 and a second band pass filter 113 in a diversity receive module 112 according to an embodiment. The wireless communication device 110 is like the wireless communication device 100 of FIG. 11, except that the wireless communication device 110 also includes diversity receive features. As illustrated in FIG. 12, the wireless communication device 110 includes a diversity antenna 111, a diversity module 112 configured to process signals received by the diversity antenna 111 and including a filter 113, and a transceiver 114 in communication with both the radio frequency front end 102 and the diversity receive module 112. The filter 113 can be implemented in accordance with any suitable principles and advantages of the filters discussed herein. For instance, the filter 113 can implement any suitable combination of features discussed with reference to any of FIGS. 1 to 10B.

Any of the principles and advantages discussed herein can be applied to other suitable systems, modules, chips, filter assemblies, filters, wireless communication devices, and methods not just to the systems, modules, chips, filter assemblies, filters, wireless communication devices, and methods described above. The elements and operations of the various embodiments described above can be combined to provide further embodiments. Any of the principles and advantages discussed herein can be implemented in association with radio frequency circuits configured to process signals having a frequency in a range from about 30 kHz to 300 GHz, such as a frequency in a range from about 450 MHz to 6 GHz. In some instances, filter according to an embodiment can filter RF signals at frequencies up to and including millimeter wave frequencies.

Aspects of this disclosure can be implemented in various electronic devices. Examples of the electronic devices can include, but are not limited to, consumer electronic products, parts of the consumer electronic products such as chips and/or packaged radio frequency modules, electronic test equipment, uplink wireless communication devices, personal area network communication devices, etc. Examples of the consumer electronic products can include, but are not limited to, a mobile phone such as a smart phone, a wearable computing device such as a smart watch or an ear piece, a telephone, a television, a computer monitor, a computer, a router, a modem, a hand-held computer, a laptop computer, a tablet computer, a personal digital assistant (PDA), a vehicular electronics system such as an automotive electronics system, a microwave, a refrigerator, a stereo system, a digital music player, a camera such as a digital camera, a portable memory chip, a household appliance, etc. Further, the electronic devices can include unfinished products.

Conditional language used herein, such as, among others, "can," "could," "might," "may," "e.g.," "for example," "such as" and the like, unless specifically stated otherwise or otherwise understood within the context as used, is generally intended to convey that certain embodiments include, while other embodiments do not include, certain features, elements and/or states. The word "coupled," as generally used herein, refers to two or more elements that may be either directly coupled to each other, or coupled by way of one or more intermediate elements. Likewise, the word "connected," as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application.

While certain embodiments have been described, these embodiments have been presented by way of example only, and are not intended to limit the scope of the disclosure. Indeed, the novel devices, filters, filter assemblies, chips, methods, apparatus, and systems described herein may be embodied in a variety of other forms. Furthermore, various omissions, substitutions and changes in the form of the methods, apparatus, and systems described herein may be made without departing from the spirit of the disclosure. For example, circuit blocks described herein may be deleted, moved, added, subdivided, combined, and/or modified. Each of these circuit blocks may be implemented in a variety of different ways. The accompanying claims and their equivalents are intended to cover any such forms or modifications as would fall within the scope and spirit of the disclosure.

What is claimed is:

1. A surface acoustic wave filter comprising:
a first series arm configured to filter a radio frequency signal includes at least three circuit elements with a first surface acoustic wave resonator in parallel with a first capacitor and a second surface acoustic wave resonator in parallel with the first capacitor and the first surface acoustic wave resonator, the first surface acoustic wave resonator having a first bulk mode frequency, the second surface acoustic wave resonator have a second bulk mode frequency that is different than the first bulk mode frequency, the second surface acoustic wave resonator having a lower impedance than the first surface acoustic wave resonator at the first bulk mode frequency and the first capacitor having a capacitance that passes signals at the first bulk mode frequency;
a second series arm in serial communication with the first series arm, the second series arm having only two circuit elements with a third surface acoustic wave resonator in parallel with a second capacitor;
a third series arm in serial communication with the second series arm, the third series arm having only two circuit elements with a fourth surface acoustic wave resonator in parallel with a third capacitor; and
a shunt arm coupled between the first series arm and the second series arm with an output of the shunt arm connected to ground, the shunt arm includes a fifth surface acoustic wave resonator.

2. The surface acoustic wave filter of claim 1 is a band elimination filter and is further connected in parallel with a second filter with the surface acoustic wave filter suppressing at least one frequency band associated with a pass band of the second filter.

3. The surface acoustic wave filter of claim 1 wherein the surface acoustic wave filter provides a flatter frequency response for mid-band and high band frequencies relative to single resonator circuits.

4. The surface acoustic wave filter of claim 1 wherein the first and second surface acoustic wave resonators each have a temperature compensation layer over an interdigital transducer.

5. The surface acoustic wave filter of claim 1 wherein the first series arm and the shunt arm suppress a guided mode spurious response outside a pass band.

6. The surface acoustic wave filter of claim 1 wherein the first surface acoustic wave resonator is arranged to lower impedance at a first bulk mode frequency of the first surface acoustic wave resonator.

7. The surface acoustic wave filter of claim 1 is connected in parallel with an additional filter wherein the surface acoustic wave filter is configured to provide a first open at a first frequency, and the additional filter provides a second open at a second frequency.

8. The surface acoustic wave filter of claim 1 wherein the third surface acoustic wave resonator has a temperature compensation layer over an electrode and a piezoelectric substrate with degraded insertion loss from bulk wave propagation in the piezoelectric substrate.

9. The surface acoustic wave filter of claim 1 wherein the second capacitor is arranged to shift at least a first notch at a first frequency band to a lower frequency.

10. The surface acoustic wave filter of claim 1 wherein the second surface acoustic wave resonator has a temperature compensation layer over an interdigital electrode and a piezoelectric substrate with degraded insertion loss from bulk wave propagation in the piezoelectric substrate.

11. An acoustic wave filter assembly comprising:
a switch coupled to a common node;
a first surface acoustic wave filter coupled to the switch; and
a second surface acoustic wave filter coupled to the switch, the second surface acoustic wave filter including a first series arm including at least three circuit elements with a first surface acoustic wave resonator in parallel with a first capacitor and a second surface acoustic wave resonator in parallel with the first capacitor and the first surface acoustic wave resonator, the first surface acoustic wave resonator having a first bulk mode frequency, the second surface acoustic wave resonator having a second bulk mode frequency that is different than the first bulk mode frequency, the second surface acoustic wave resonator having a lower impedance than the first surface acoustic wave resonator at the first bulk mode frequency and the first capacitor having a capacitance that passes signals at the first bulk mode frequency, the second surface acoustic wave filter further including a second series arm in serial communication with the first series arm, the second series arm having only two circuit elements with a third surface acoustic wave resonator in parallel with a second capacitor, the second surface acoustic wave filter further including a third series arm in serial communication with the second series arm, the third series arm having only two circuit elements with a fourth surface acoustic wave resonator in parallel with a third capacitor, the second surface acoustic wave filter further including a shunt arm coupled between the first series arm and the second series arm with an output of the shunt arm connected to ground.

12. The acoustic wave filter assembly of claim 11 wherein the first and second surface acoustic wave resonators each have a temperature compensation layer over an interdigital transducer.

13. The acoustic wave filter assembly of claim 11 wherein the first series arm and the shunt arm suppress a guided mode spurious response outside a pass band.

14. The acoustic wave filter assembly of claim 11 wherein the first surface acoustic wave resonator is arranged to lower impedance at a first bulk mode frequency of the first surface acoustic wave resonator.

15. The acoustic wave filter assembly of claim 11 is connected in parallel with an additional filter wherein the second surface acoustic wave filter is configured to provide a first open at a first frequency, and the additional filter provides a second open at a second frequency.

16. The acoustic wave filter assembly of claim 11 is a band elimination filter and is further connected in parallel with a second filter with the acoustic wave filter suppressing at least one frequency band associated with a pass band of the second filter.

17. The acoustic wave filter assembly of claim 11 wherein the acoustic wave filter provides a flatter frequency response for mid-band and high band frequencies relative to single resonator circuits.

18. The acoustic wave filter assembly of claim 11 wherein the second capacitor is arranged to shift at least a first notch at a first frequency band to a lower frequency.

19. The acoustic wave filter assembly of claim 11 wherein the second surface acoustic wave resonator has a temperature compensation layer over an interdigital electrode and a piezoelectric substrate with degraded insertion loss from bulk wave propagation in the piezoelectric substrate.

20. The acoustic wave filter assembly of claim 11 wherein the third surface acoustic wave resonator has a temperature compensation layer over at least an electrode and a piezoelectric substrate with degraded insertion loss from bulk wave propagation in the piezoelectric substrate.

* * * * *